US008889510B2

(12) United States Patent
Xiao et al.

(10) Patent No.: US 8,889,510 B2
(45) Date of Patent: Nov. 18, 2014

(54) SURROUNDING STACKED GATE MULTI-GATE FET STRUCTURE NONVOLATILE MEMORY DEVICE (71) Applicants: Semiconductor Manufacturing International (Shanghai) Corporation, Shanghai (CN); Semiconductor Manufacturing International (Beijing) Corporation, Beijing (CN)

(72) Inventors: De Yuan Xiao, Shanghai (CN); Lily Jiang, Shanghai (CN); Gary Chen, Boise, ID (US); Roger Lee, Eagle, ID (US)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 13/940,256

(22) Filed: Jul. 12, 2013

(65) Prior Publication Data
US 2013/0302951 A1 Nov. 14, 2013

Related U.S. Application Data (62) Division of application No. 12/892,879, filed on Sep. 28, 2010, now Pat. No. 8,513,727.

(30) Foreign Application Priority Data

Sep. 28, 2009 (CN) .......................... 2009 1 0057968

(51) Int. Cl.
*H01L 21/336* (2006.01)
*H01L 29/423* (2006.01)
(Continued)

(52) U.S. Cl.
CPC .... *H01L 29/66825* (2013.01); *H01L 29/42324* (2013.01); *H01L 27/1211* (2013.01);
(Continued)

(58) Field of Classification Search
None
See application file for complete search history.

(56) References Cited

U.S. PATENT DOCUMENTS 6,767,791 B1  7/2004  Wu et al.
8,513,727 B2  8/2013  Xiao et al.
(Continued)

OTHER PUBLICATIONS

Restriction Requirement for U.S. Appl. No. 12/892,879 mailed Apr. 27, 2012, 7 pages.
Non-Final Office Action for U.S. Appl. No. 12/892,879 mailed Jun. 8, 2012, 9 pages.
Final Office Action for U.S. Appl. No. 12/892,879 mailed Jan. 14, 2013, 11 pages.
(Continued)

*Primary Examiner* — Benjamin Sandvik
*Assistant Examiner* — Leslie Pilar Cruz
(74) *Attorney, Agent, or Firm* — Kilpatrick Townsend & Stockton LLP (57) ABSTRACT

A method for forming a surrounding stacked gate fin FET nonvolatile memory structure includes providing a silicon-on-insulator (SOI) substrate of a first conductivity type, patterning a fin active region on a region of the substrate, forming a tunnel oxide layer on the fin active region, and depositing a first gate electrode of a second conductivity type on the tunnel oxide layer and upper surface of the substrate. The method further includes forming a dielectric composite layer on the first gate electrode, depositing a second gate electrode on the dielectric composite layer, patterning the first and second gate electrodes to define a surrounding stacked gate area, forming a spacer layer on a sidewall of the stacked gate electrode, and forming elevated source/drain regions in the fin active region on both sides of the second gate electrode.

18 Claims, 7 Drawing Sheets

(51) Int. Cl.
*H01L 27/12* (2006.01)
*H01L 27/115* (2006.01)
*H01L 29/66* (2006.01)
*H01L 21/28* (2006.01)
*H01L 21/84* (2006.01)
*H01L 29/788* (2006.01)
*H01L 29/78* (2006.01)

(52) U.S. Cl.
CPC ........ *H01L 29/785* (2013.01); *H01L 27/11521* (2013.01); *H01L 21/28273* (2013.01); *H01L 21/845* (2013.01); *H01L 29/7881* (2013.01)
USPC ........... 438/257; 438/264; 438/266; 438/594; 257/315; 257/316; 257/321; 257/401; 257/E21.619; 257/E29.116; 257/E29.122

(56) References Cited

U.S. PATENT DOCUMENTS

| | | | | |
|---|---|---|---|---|
| 2003/0193065 A1* | 10/2003 | Fried et al. | ..................... | 257/328 |
| 2004/0004863 A1* | 1/2004 | Wang | ............................. | 365/199 |
| 2004/0099885 A1* | 5/2004 | Yeo et al. | ....................... | 257/208 |
| 2004/0266077 A1 | 12/2004 | Yeo et al. | | |
| 2005/0145926 A1* | 7/2005 | Lee | ................. | 257/316 |
| 2005/0282345 A1* | 12/2005 | Mathew et al. | ................ | 438/301 |
| 2007/0210338 A1 | 9/2007 | Orlowski | | |

OTHER PUBLICATIONS

Notice of Allowance for U.S. Appl. No. 12/892,879 mailed May 10, 2013, 8 pages.

* cited by examiner

Cross sectional view along A-A'

Cross sectional view along B-B'

SURROUNDING STACKED GATE MULTI-GATE FET STRUCTURE NONVOLATILE MEMORY DEVICE

CROSS-REFERENCES TO RELATED APPLICATIONS

This application is a divisional application of U.S. application Ser. No. 12/892,879, filed Sep. 28, 2010, the entire content of which is incorporated herein by reference for all purposes. The U.S. application Ser. No. 12/892,879 claims the benefit and priority under 35 U.S.C 119 of Chinese Patent Application No. 200910057968.7, filed Sep. 28, 2009 by inventors Deyuan Xiao et al., commonly assigned and incorporated in its entirety by reference herein for all purposes.

BACKGROUND OF THE INVENTION

The present invention is generally related to integrated circuit devices and their processing for the manufacture of semiconductor devices. More particularly, the present invention provides a method for forming a surrounding stacked gate fin field effect transistor (fin FET) structure nonvolatile memory device.

As semiconductor memory devices become increasingly integrated, the feature size including the channel length of individual devices is gradually reduced. This causes a short channel effect and also increases the junction leakage current. Leakage current was not a significant problem in the past, but it has become more serious concern now that transistor gates and other chip components measure only a few atoms thick. In a notebook computer, leakage current means short battery life and in a server computer, it means higher power bills. Also, in a nonvolatile memory device, the leakage current leads to degradation of data retention time and other electrical characteristics as the device feature size is reduced.

To solve these problems, fin field effect transistors (fin FETs) that have fin-shaped silicon active regions have been introduced. Among other things, the fin-shaped silicon active region typically enables multi-gate FET devices. For example, a conducting region (e.g., gate region) wraps around the fin-shaped silicon structure. Since a gate electrode is formed on the fin active region, a fin FET may use an entire face of a projected-portion as a channel. Thus, the channel length is often sufficient to prevent or substantially reduce the short channel effect. Such a fin FET can effectively control a leakage current generated in a channel, hence, substantially improve swing characteristics of the transistor and decrease the leakage current.

However, depending on the dimension of the fin active region, the threshold voltage is often difficult to control in fin FETs compared to a planar-type transistor. Furthermore, a leakage current is generated in an off state of the fin FET, and a gate induced drain leakage (GIDL) current and a junction leakage current are not distinctly improved compared to the planar type transistor and the recess type transistor.

Therefore, there is a need for nonvolatile memory devices that have a low off state leakage current and reduced short channel effect. In addition, there is a demand for a nonvolatile memory device having an excellent data retention time characteristics.

BRIEF SUMMARY OF THE INVENTION

The present invention is generally related to integrated circuit devices and methods of manufacturing semiconductor devices. More particularly, the present invention provides a method and structure for forming a surrounding stacked gate fin field effect transistor (fin FET) nonvolatile memory device.

In a specific embodiment, the invention provides a fin field effect transistor nonvolatile memory structure comprising a silicon-on-insulator (SOI) substrate of a first conductivity type and a fin active region projecting from an upper surface of the insulator. The structure further includes a tunnel oxide layer formed on the fin active region and a first gate electrode disposed on the tunnel oxide layer and upper surface of the insulator. Additionally, the structure includes an oxide/nitride/oxide (ONO) composite layer formed on the first gate electrode, a second gate electrode formed on the ONO composite layer and patterned so as to define a predetermined area of the ONO composite layer. The structure further includes a dielectric spacer formed on a sidewall of the second gate electrode and source/drain regions formed in the fin active region on both sides of the second gate electrode.

In another specific embodiment, a method of forming a fin field effect transistor nonvolatile memory structure is provided. The method includes providing a silicon-on-insulator substrate and patterning a fin active region on a predetermined region of the silicon-on-insulator substrate, the fin active region projecting from a surface of the insulator. The method further includes forming a tunnel oxide layer on the fin active region and depositing a first gate electrode on the tunnel oxide layer and on the upper surface of the insulator. In addition, the method includes forming a dielectric composite layer on the first gate electrode and depositing a second gate electrode on the dielectric composite layer. The method additionally includes patterning the first and second gate electrodes so as to define the area of the dielectric composite layer and forming a spacer layer on a sidewall of the second gate electrode. The method further includes forming source/drain regions in the fin active region on both sides of the second gate electrode.

Many benefits are achieved by way of the present invention over conventional techniques. The present invention offers significant unobvious advantages in the fabrication of nonvolatile memory devices having a reduced short-channel effect and a low off-state leakage current. In some embodiments, the present invention provides an increased oxide/nitride/oxide (ONO) dielectric contact area, enlarged floating gate coupling ratio, improved program/erasure speed, and enlarged data retention time, which are not obtainable with conventional process technology or structure. Depending upon the embodiment, one or more of these benefits may be achieved.

Various additional embodiments, features, and advantages of the present invention, as well as the structure and operation of the various embodiments of the present invention, are described in detail below with reference to the accompanying drawings.

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE EMBODIMENTS

The present invention generally relates to integrated circuit devices and their processing for the manufacture of semiconductor devices. More particularly, the present invention provides a method for forming a surrounding stacked gate fin field effect transistor (fin FET) structure nonvolatile memory device.

Exemplary embodiments of the invention are more fully described in detail with reference to the accompanied drawings. The invention may be embodied in many different forms and should not be construed as being limited to the exemplary embodiments set forth herein. Rather, these exemplary embodiments are provided so that this disclosure is thorough and complete, and to convey the concepts of the invention to those skilled in the art.

Figure 1A:
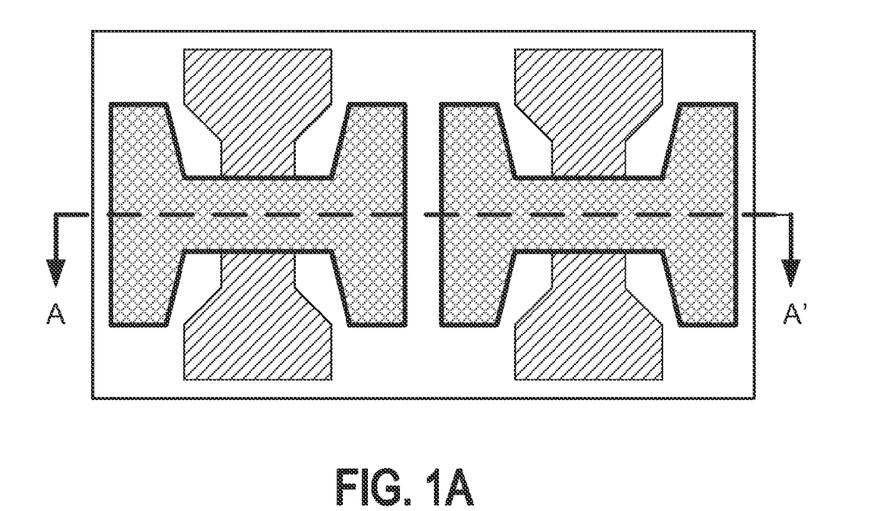
FIG. 1A is a simplified top view of a surrounding stacked gate fin FET structure nonvolatile memory (NVM) device according to an embodiment of the present invention.

FIG. 1A is a simplified top view of a surrounding stacked gate fin FET structure nonvolatile memory (NVM) device according to an embodiment of the present invention. This diagram is merely an example, which should not unduly limit the scope of the claims. One of ordinary skill in the art would recognize many variations, alternatives, and modifications. The fin FET nonvolatile memory device may employ a silicon-on-insulator (SOI) substrate. The SOI substrate is composed of silicon film/buried oxide (insulator)/and silicon substrate. Compared with bulk-silicon substrate, SOI field effect transistors show many outstanding features including better short channel effect and reduced junction leakage. Also, a three dimensional integration is possible. A surrounding stacked gate fin FET structure nonvolatile memory device employs three dimensional fin type stacked gates composed of floating gate and control gate.

Figure 1B:
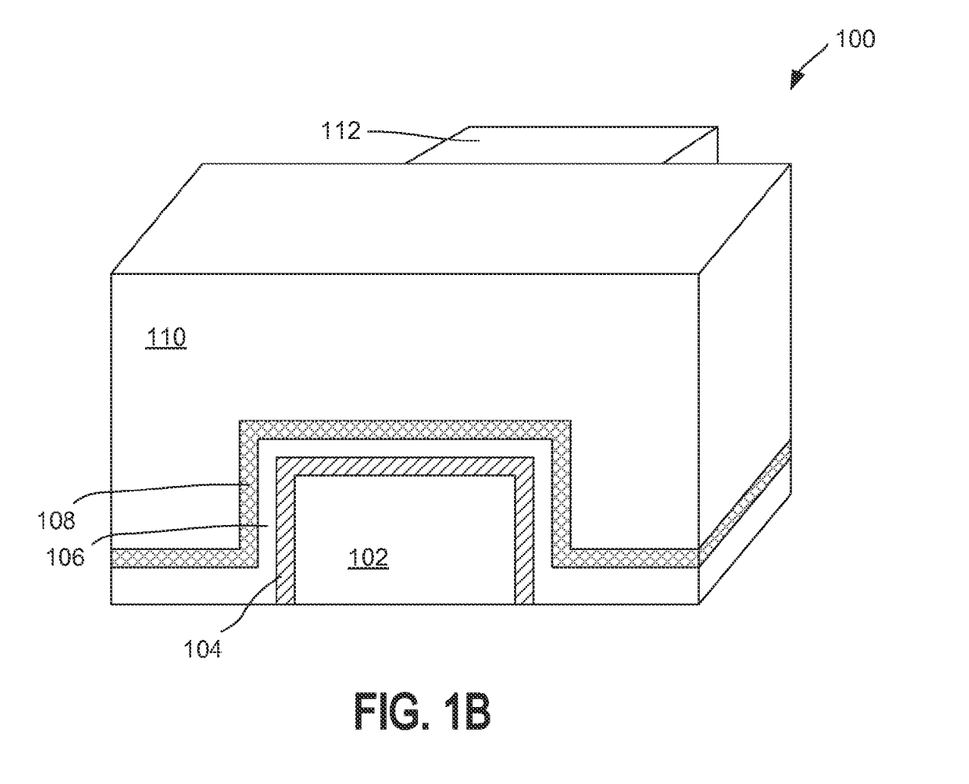
FIG. 1B is a simplified perspective sectional view taken along the line A-A' of FIG. 1A.

FIG. 1B is a simplified perspective sectional view taken along the line A-A' of FIG. 1A. This diagram is merely an example, which should not unduly limit the scope of the claims. One of ordinary skill in the art would recognize many variations, alternatives, and modifications. As shown in FIG. 1B, silicon fin 102 is defined by photolithographic masking step followed by silicon active area etch step. Since the silicon fin 102 constitutes a channel region of the device, the dimension of the silicon fin 102 is predetermined in view of the required minimum channel width and other design factors including the gate dielectric contact area, which is related to the data retention time. A tunnel oxide 104 is formed on the surface of the silicon fin 102 to be used as a gate oxide of the floating gate 106.

As known to those in the art, nonvolatile memory's data retention time is closely related to the integrity and dimension of the gate dielectric layer 108 to be formed between the floating gate 106 and control gate 110. Source and drain regions are formed in areas 112 located on both sides of the control gate 110. In the present embodiment, a nonvolatile memory device 100 having a channel length of 20 nm, silicon fin thickness of 6 nm, and silicon fin width of 10 nm was fabricated.

Figure 2:
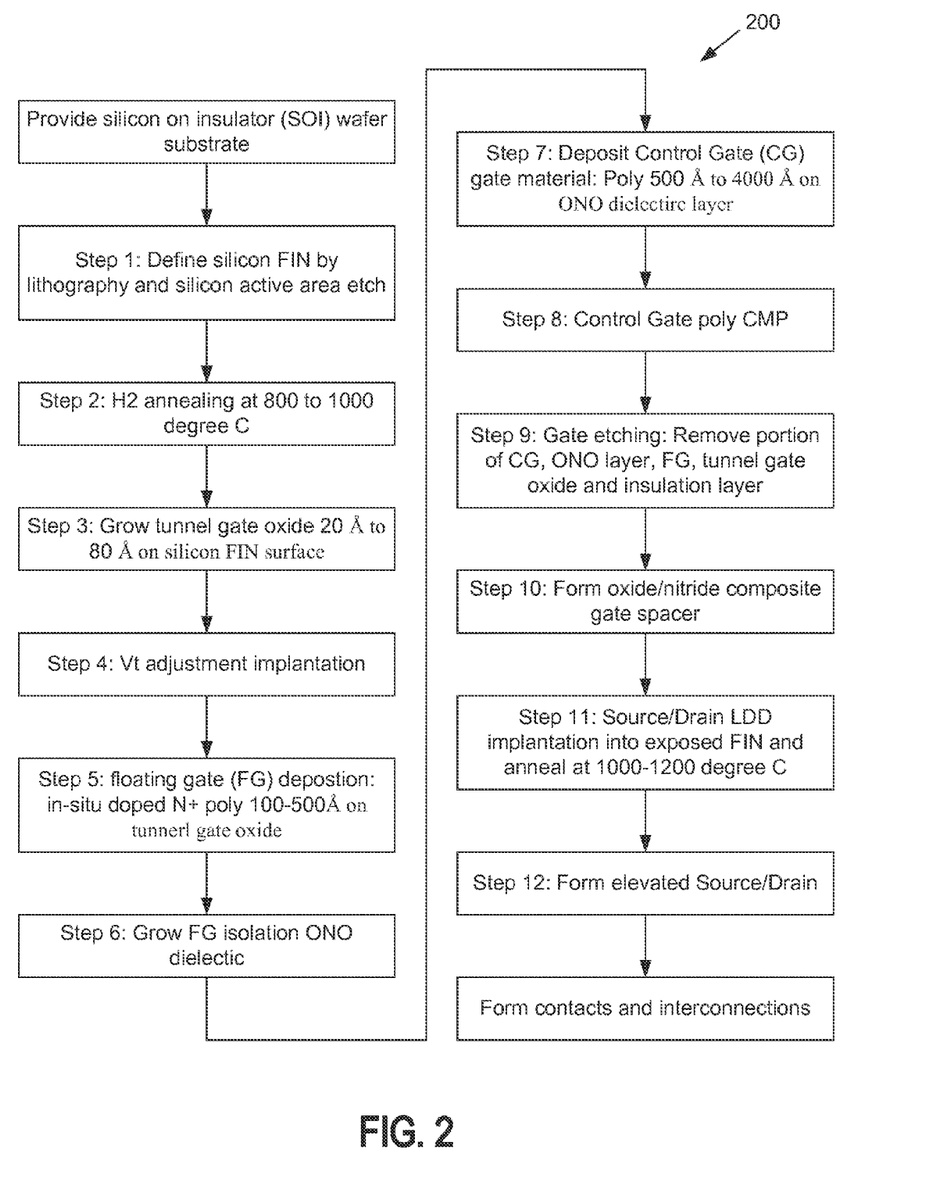
FIG. 2 is an exemplary simplified process flows showing processes used for formation of a surrounding stacked gate fin FET structure NVM device according to embodiments of the present invention.

FIG. 2 is an exemplary simplified process flows showing processes used for formation of a surrounding stacked gate fin FET structure nonvolatile memory device according to embodiments of the present invention. This diagram is merely an example, which should not unduly limit the scope of the claims. One of ordinary skill in the art would recognize many variations, alternatives, and modifications.

Referring to FIG. 2, a method 200 for forming a surrounding stacked gate fin FET structure nonvolatile memory device according to embodiments of the present invention can be outlined as follows:

1. Provide a semiconductor substrate, e.g., a silicon on insulator (SOI) wafer substrate;
2. Define (step 1) a silicon fin using lithography and silicon active area etching;
3. Anneal (step 2) the silicon fin in a hydrogen atmosphere;
4. Grow (step 3) a tunnel gate oxide of a thickness of about 20 Å to 80 Å on the surface of the silicon fin using a thermal method;
5. Adjust (step 4) the threshold voltage Vt of the nonvolatile memory device by implantation;
6. Deposit (step 5) a floating gate (FG) to a thickness of about 100 Å to 500 Å on the tunnel gate oxide by in-situ n+ doped polysilicon technique;
7. Grow FG isolation layer (step 6) such as oxide/nitride/oxide (ONO) dielectric layer having a thickness of about 20 Å to 100 Å;
8. Deposit (step 7) a control gate (CG) material such as a polysilicon having a thickness of about 500 Å to 4000 Å on the ONO dielectric layer;
9. Planarize (step 8) the control gate surface using a chemical mechanical polishing (CMP) process;
10. Remove (e.g., etch) a portion of the control gate, ONO dielectric layer, floating gate, tunnel oxide layer and insulation layer for obtaining a surrounding stacked gate fin structure (step 9);
11. Form (step 10) a gate spacer on the sidewalls of the stacked gates including the floating gate and the control gate;
12. Implant n-type impurity to form an n+ type source/drain region in the fin active region of both sides of the gate electrode using the gate spacer as a mask and anneal the source/drain region at 1000° C. to 1200° C. to obtain a lightly doped (LDD) structure (step 11);
13. Form (step 12) an elevated source/drain region;
14. Form contacts and interconnects; and
15. Perform other processes.

The process flows shown in FIG. 2 are further illustrated in FIG. 3A-3K where exemplary sequential processes for forming the fin FET of FIG. 1, taken along the line A-A' of FIG. 1, are illustrated.

Figure 3A:
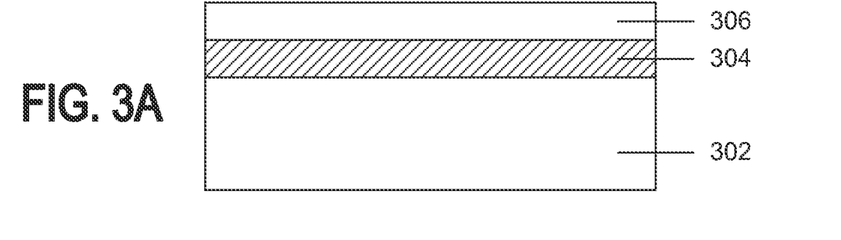
FIGS. 3A-3K are simplified sectional diagrams illustrating exemplary sequential processes for forming the fin FET of FIG. 1, taken along the line A-A' of FIG. 1.
Figure 3B:
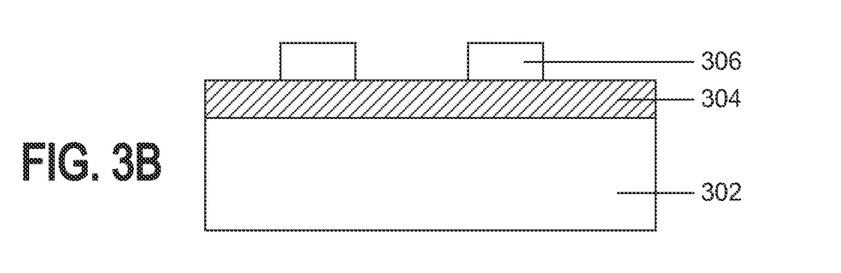

FIG. 3A is a cross-sectional diagram illustrating an SOI substrate composed of a pre-defined active fin silicon 306, insulator 304, and silicon substrate 302. This diagram is merely an example, which should not unduly limit the scope of the claims. One of ordinary skill in the art would recognize many variations, alternatives, and modifications. In a specific embodiment, the active fin silicon 306 is formed to a height that is in the range of about 1000 Å to 3000 Å from the upper surface of the insulator 304 (step 1 of FIG. 2). Referring to step 2 of FIG. 2 and FIG. 3B, a defined fin-shaped silicon 306 is annealed in a hydrogen atmosphere at a temperature in the range of about 800° C. to 1000° C. This hydrogen annealing step is necessary to improve the surface characteristics of the silicon fin active area by annealing out dangling silicon bonds and other interface states. It is to be understood that other types of annealing processes may be used as well.

Figure 3C:
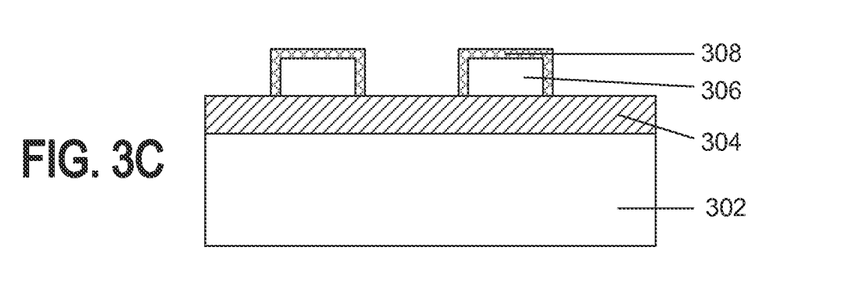

Referring to FIG. 3C, a tunnel gate oxide forming step is illustrated. This diagram is merely an example, which should not unduly limit the scope of the claims. One of ordinary skill in the art would recognize many variations, alternatives, and modifications. The tunnel gate oxide 308 is grown on the surface of the silicon fin area 306 by a thermal method to a thickness that is in the range of about 20 Å to 80 Å (step 3 of FIG. 2). For example, the thermal method for growing tunnel gate oxide 308 may be similar conventional techniques. Depending on the resistivity or doping level of the silicon fin area 306, a threshold voltage (Vt) implantation step (step 4 in FIG. 2) is performed after the tunnel gate oxide is formed in order to adjust the threshold voltage of the nonvolatile memory device.

Figure 3D:
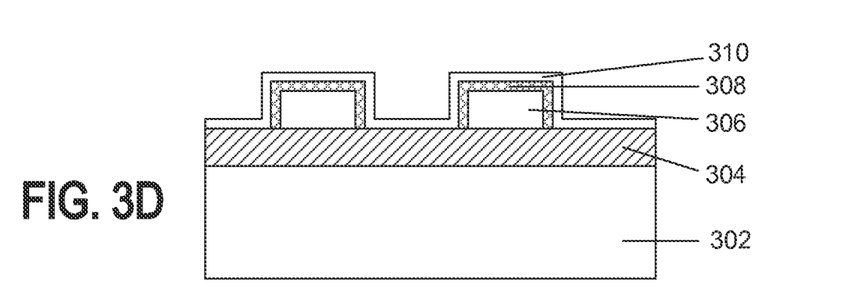
Figure 3E:
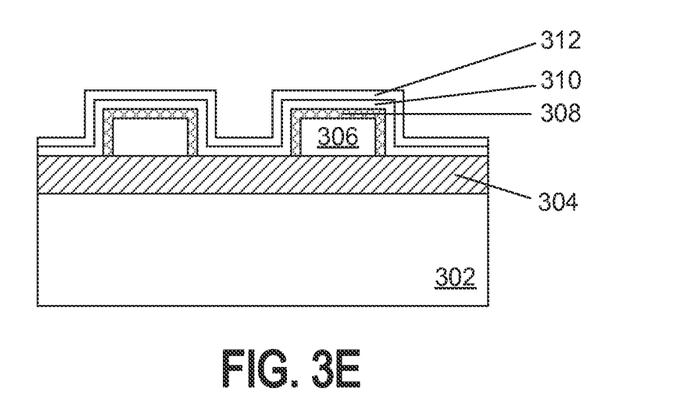
Figure 3F:
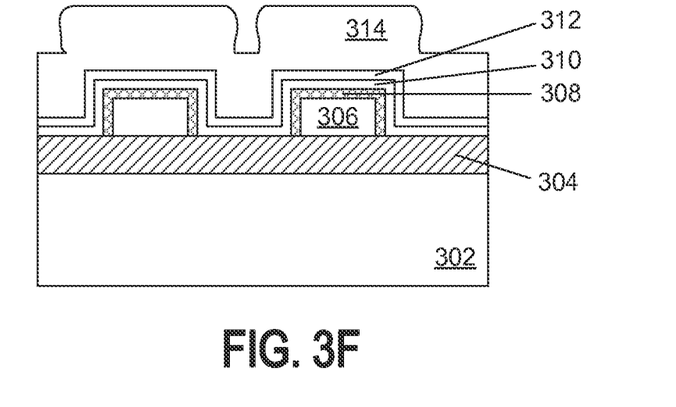

Referring to FIGS. 3D-3F, a floating gate 310 is deposited before a gate dielectric layer 312 is formed on the floating gate (step 5). This diagram is merely an example, which should not unduly limit the scope of the claims. One of ordinary skill in the art would recognize many variations, alternatives, and modifications. The floating gate 310 is deposited to a thickness of about 100 Å to 500 Å by in-situ n+ doped polysilicon technique according to one embodiment of the present invention. It can also be formed by other conventional polysilicon deposition method, which is followed by n+ doping.

The gate dielectric layer 312 is composed of, among other things, oxide/nitride/oxide (ONO) composite layer having a thickness of about 20 Å to 100 Å (step 6). ONO layers are sequentially formed before a control gate 314 is deposited on them. For example, the control gate is about 500 Å to 4000 Å thick (step 7). Since the integrity and thickness of the ONO layer can affect the data retention characteristics of the nonvolatile memory device, the thickness of ONO layers is subject to specific design targets.

Figure 3G:
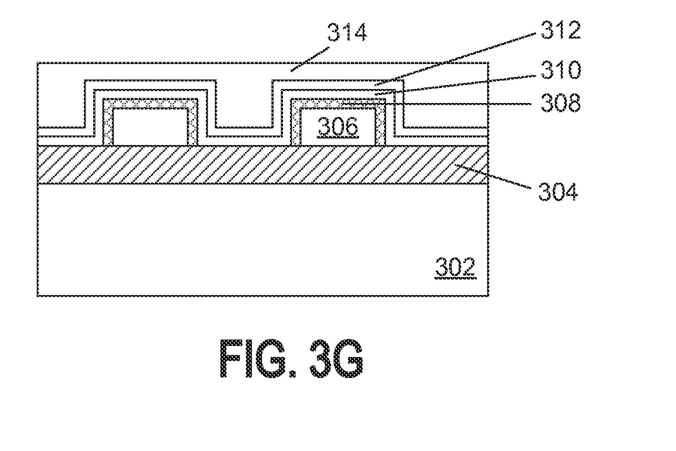

Referring to FIG. 3G, a chemical mechanical polishing (CMP) step is performed to even out the irregular topography formed by the control gate 314 and other underlying layers including the fin silicon area 306 and the floating gate 310 (step 8). This diagram is merely an example, which should not unduly limit the scope of the claims. One of ordinary skill in the art would recognize many variations, alternatives, and modifications. The CMP process uses an abrasive and corrosive chemical slurry in conjunction with a polishing pad and retaining ring, typically of a greater diameter than the wafer. The pad and wafer are pressed together by a dynamic polishing head and held in place by a plastic retaining ring. The dynamic polishing head is rotated at different rates, with different axes of rotation. This removes material and tends to even out irregular topography, making the wafer flat or planar. This may be necessary in order to bring the entire surface within the depth of field of a photolithography system.

Figure 3H:
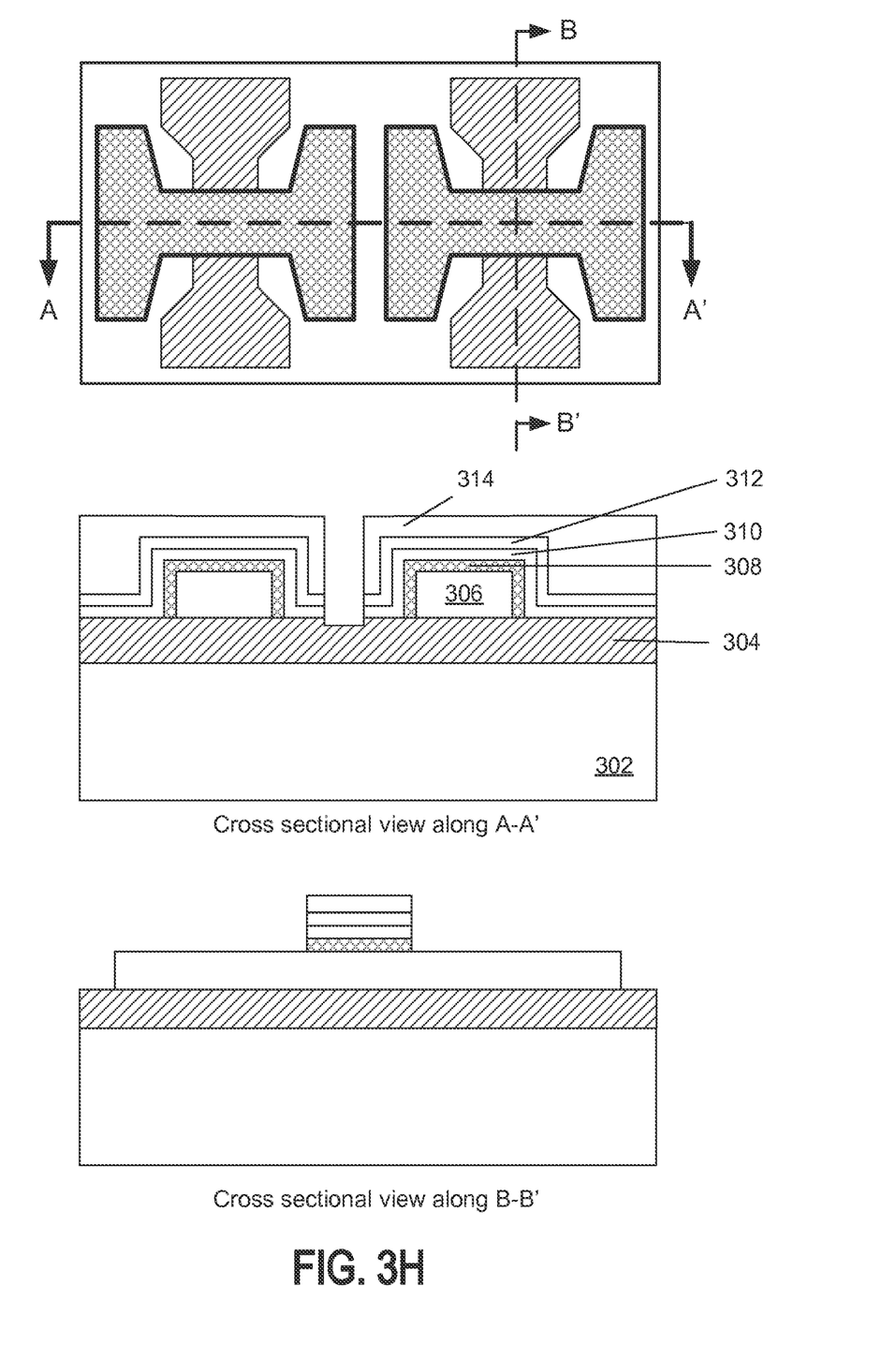

FIG. 3H illustrates a simplified plan view after the gate etch step (step 9) is done (top). A cross-sectional view taken along the line A-A' is shown in the middle and another cross-sectional view taken along the line B-B' is shown in the bottom side of FIG. 3H. This diagram is merely an example, which should not unduly limit the scope of the claims. One of ordinary skill in the art would recognize many variations, alternatives, and modifications. As shown in the cross-sectional views, exposed portions of the control gate, ONO layer, floating gate, tunnel gate oxide, and insulator 304 are sequentially etched during the gate etch step.

Figure 3I:
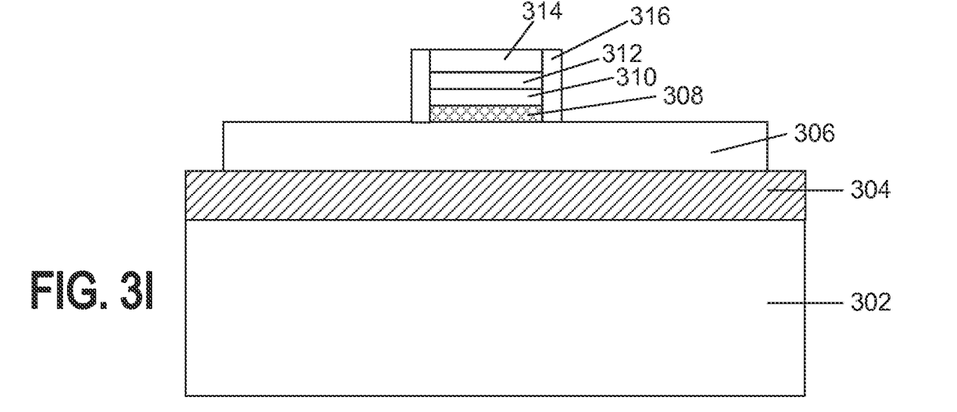
Figure 3J:
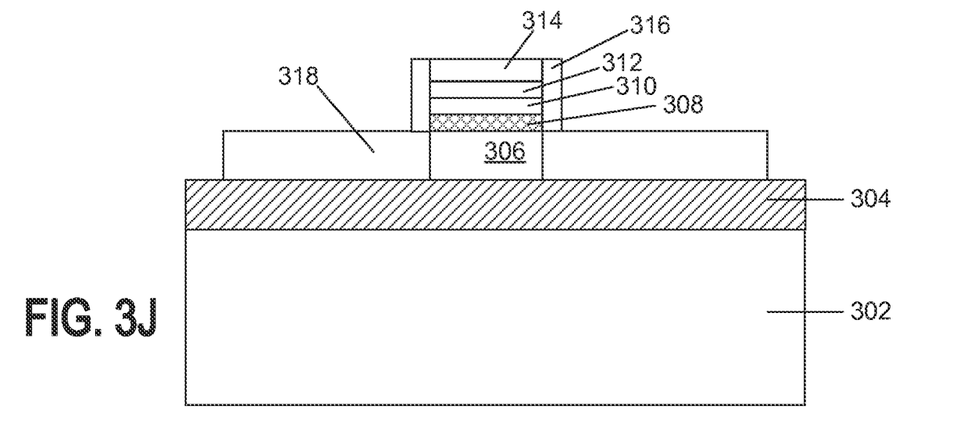

Referring to FIGS. 3I-3J, a gate spacer 316 composed of oxide/nitride composite layer is formed on a sidewall of the stacked gates including the floating gate 310 and control gate 314 (step 10). For example, the gate spacer 316 functions in at least two ways: (1) function as the LDD spacer; (2) functions as isolation layer for forming an elevated source/drain regions.

After forming the gate spacer 316, n-type impurity ions such as P (phosphorous) or As (Arsenic), etc., are ion implanted at an energy of about 10 KeV to 20 KeV and to a density of about $1.0E^{15}$ to $3.0E^{15}$ ion atoms/cm$^3$. Here, the gate spacer 316 is used as an ion implantation mask to form an n+ type source/drain region 318 of a high density in the fin active region of both sides of the gate electrode. Also, before forming the gate spacer 316, n-type impurities are ion-implanted at a relatively low energy and to a relatively low density compared to the source/drain regions 318, thus forming a low density n-type source/drain region. Next, a n+ type source/drain region having a density higher than the low density n-type source/drain region is formed on a portion of the low density n-type source/drain region. Thus, a source/drain region having a LDD (Lightly Doped Drain) structure is finally obtained after an annealing step at 1000° C. to 1200° C. in an inert ambient is carried out to activate the impurity ions (step 11 of FIG. 2).

Figure 3K:
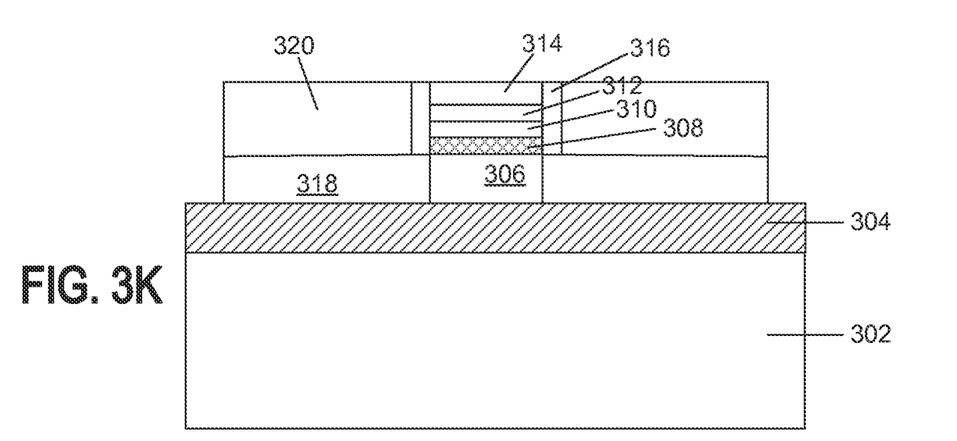

As shown in FIG. 3K, an elevated source/drain region is formed (step 12). The elevated or raised source/drain structures 320 may be fabricated by various methods. For example, methods include growing a selective epitaxial silicon layer in the source and drain regions of the FET device after sidewall spacer creation and after LDD implantation. The elevated source/drain layers are grown in a low pressure LPCVD epitaxy reactor with a mixture of silane and dichlorosilane or any other gas mixture. Since series resistances can be minimized by employing the elevated source/drain structure, drive current characteristics are improved.

Figure 4A:
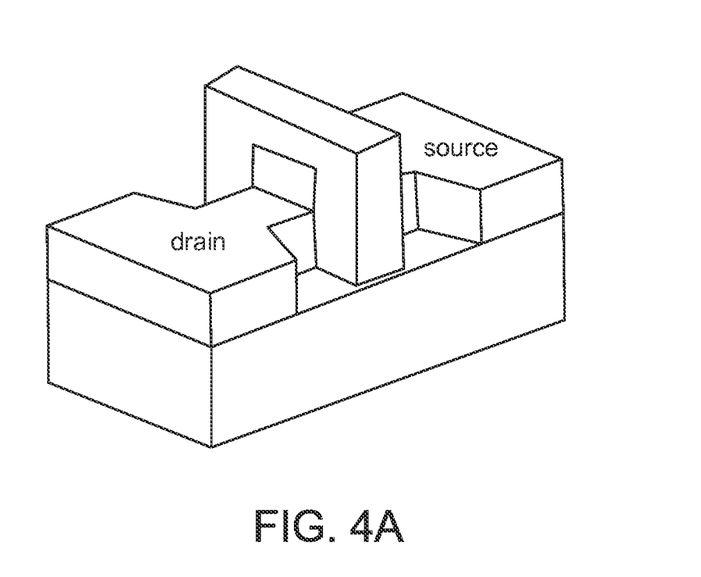
FIG. 4A is a simplified perspective view of the surrounding stacked gate fin FET nonvolatile memory structure according to an exemplary embodiment of the invention.
Figure 4B:
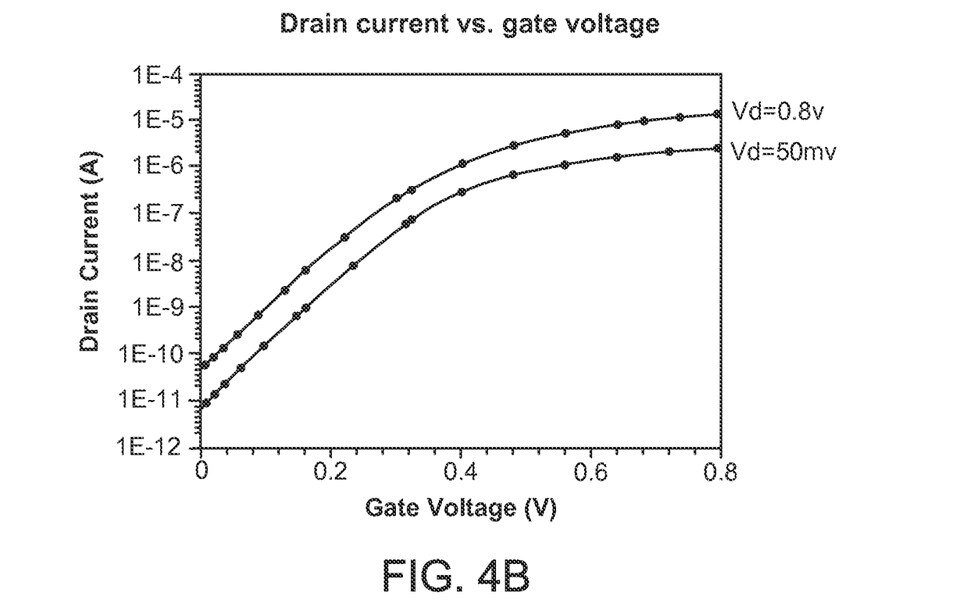
FIG. 4B is a graph illustrating the drain current characteristics of the nonvolatile memory structure of FIG. 4A according to an exemplary embodiment of the invention.

FIG. 4A is a simplified perspective view of the surrounding stacked gate fin FET nonvolatile memory structure and FIG. 4B is a graph illustrating the drain current vs. gate voltage characteristics of the nonvolatile memory structure of FIG. 4A according to an exemplary embodiment of the invention. Referring to FIG. 4B, better subthreshold slope (mV/dec) is obtained due to the excellent floating gate ratio and improved off state leakage current characteristics. Also, it has been observed that other characteristics of the nonvolatile memory device including a data retention time and program/erase speed are improved by adopting the structure mentioned above.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method of forming a surrounding stacked gate fin FET nonvolatile memory structure, the method comprising:
   providing a silicon-on-insulator substrate of a first conductivity type;
   patterning a fin active region on a predetermined region of the silicon-on-insulator substrate, the fin active region projecting from a surface of the substrate;
   forming a tunnel oxide layer on the fin active region;

depositing a first gate electrode on the tunnel oxide layer and upper surface of the substrate;

forming a dielectric composite layer on the first gate electrode;

depositing a second gate electrode on the dielectric composite layer;

patterning the first and second gate electrodes so as to define a surrounding stacked gate area;

forming a spacer layer on a sidewall of the stacked gate electrodes;

forming elevated source/drain regions in the fin active region on both sides of the second gate electrode; and planarizing the elevated source/drain regions so that a top surface of the planarized source/drain regions is substantially coplanar with a top surface of the second gate electrode.

2. The method of claim 1, wherein the dielectric composite layer is composed of an oxide/nitride/oxide composite layer.

3. The method of claim 1, wherein the patterned fin active region is annealed at a range of about 800° C. to 1000° C. in a hydrogen atmosphere.

4. The method of claim 1, wherein the tunnel oxide layer receives a threshold voltage implantation to adjust the threshold voltage.

5. The method of claim 1, further comprising performing a chemical mechanical polishing of the second gate electrode before patterning the first and second gate electrodes.

6. The method of claim 1, wherein the spacer layer is composed of oxide/nitride composite layer.

7. The method of claim 1, wherein the source/drain region comprises a lightly doped drain (LDD) structure having a low-density source/drain region and a high-density source/drain region.

8. The method of claim 1, wherein the elevated source/drain regions are formed by growing a selective epitaxial silicon layer in the fin active region.

9. The method of claim 1, wherein the elevated source/drain regions are formed to a height that is about 1000 Å to about 3000 Å from the upper surface of the insulator.

10. The method of claim 1, wherein depositing the first gate electrode comprises doping in-situ a polysilicon material with a second conductive impurity.

11. The method of claim 1, wherein the tunnel oxide layer has a thickness in a range between 20 Angstroms and 80 Angstroms.

12. The method of claim 1, wherein the dielectric composite layer has a thickness in a range between 20 Angstroms and 100 Angstroms.

13. The method of claim 1, wherein the first gate electrode has a thickness in a range between 100 Angstroms and 500 Angstroms.

14. The method of claim 1, wherein the second gate electrode has a thickness in a range between 500 Angstroms and 4000 Angstroms.

15. The method of claim 1, wherein the first gate electrode is a floating gate configured to store data by trapping electrons when a program voltage is applied to the second gate electrode.

16. The method of claim 15, wherein the program voltage is higher than a voltage applied to a drain region.

17. The method of claim 1, wherein the second gate electrode is a control gate configured to turn on a channel of the fin FET nonvolatile memory structure when a control voltage is applied to the second gate electrode.

18. The method of claim 1, wherein the source/drain regions are doped with phosphorous ions.

* * * * *